United States Patent [19]

Ooga et al.

[11] Patent Number: 4,725,874
[45] Date of Patent: Feb. 16, 1988

[54] SEMICONDUCTOR DEVICE HAVING PROTECTED EDGES

[75] Inventors: Hirotomo Ooga; Hiromi Sakurai, both of Itami, Japan

[73] Assignee: Mitsubishi Denki Kabushiki Kaisha, Tokyo, Japan

[21] Appl. No.: 919,554

[22] Filed: Oct. 16, 1986

Related U.S. Application Data

[60] Continuation of Ser. No. 688,838, Jan. 4, 1985, abandoned, which is a division of Ser. No. 404,051, Aug. 2, 1982, Pat. No. 4,499,657, which is a continuation of Ser. No. 125,866, Feb. 29, 1980, abandoned.

[30] Foreign Application Priority Data

Mar. 26, 1979 [JP] Japan .................................. 54-37472

[51] Int. Cl.$^4$ ........................................... H01L 27/02
[52] U.S. Cl. .................................... 357/41; 357/55; 357/49; 357/58; 357/59; 357/47; 357/50; 357/36; 357/34
[58] Field of Search ....................... 357/49, 55, 41, 34, 357/54, 43, 36, 47, 50, 59 H, 45

[56] References Cited

U.S. PATENT DOCUMENTS

| | | | |
|---|---|---|---|
| 3,600,651 | 8/1971 | Duncan | 357/59 |
| 3,607,466 | 9/1971 | Miyazaki | 357/69 X |
| 3,611,067 | 10/1971 | Oberlin et al. | 357/59 X |
| 3,977,017 | 8/1976 | Ishitani | 357/36 X |
| 3,982,264 | 9/1976 | Ishitani | 357/36 X |
| 4,036,672 | 7/1977 | Kobayashi | 357/59 X |
| 4,338,618 | 7/1982 | Nishizawa | 357/50 X |

OTHER PUBLICATIONS

Jambotkar et al, "Fabrication of Power Transistors," *IBM Technical Disclosure Bulletin*, vol. 20, No. 10, Mar. 1978, pp. 3977-3979.

Okada et al, "A New Polysilicon Process for a Bipolar Device-PSA Technology," *IEEE Transactions on Electron Devices*, vol. Ed-26, No. 4, Apr., '79, 385-9.

Sakai et al., "Elevated Electrode Integrated Circuits," Ibid., 379-384.

*Primary Examiner*—Andrew J. James
*Assistant Examiner*—William A. Mintel
*Attorney, Agent, or Firm*—Wenderoth, Lind & Ponack

[57] ABSTRACT

An N$^-$ silicon layer is epitaxially grown on an oxide film with predetermined openings disposed on one main face of an N$^+$ silicon substrate to form monocrystalline portions on the openings and polycrystalline portions on the oxide film. Ion implantation and thermal annealing is used to convert the polycrystalline portions to P$^+$ external base regions and form P$^+$ internal base regions in the monocrystalline portions. Arsenic ions are selectively implanted into the internal base regions to form N$^+$ emitter regions. Then, base and emitter electrodes are formed on the external base and emitter regions so as to be electrically insulated from one another by an oxide film and a collector electrode is formed on the other main face of the substrate.

1 Claim, 19 Drawing Figures

SEMICONDUCTOR DEVICE HAVING PROTECTED EDGES

This application is a continuation of now abandoned application Ser. No. 688,838, filed Jan. 4, 1985, which in turn is a divisional application of allowed application Ser. No. 404,051, filed Aug. 2, 1982, now U.S. Pat. No. 4,499,657, which is in turn a continuation of now abandoned application Ser. No. 125,866, filed Feb. 29, 1980.

BACKGROUND OF THE INVENTION

This invention relates to a semiconductor device. More particularly, the invention concerns a high frequency, high output bipolar transistor.

In order to increase the power gain of high frequency, high output bipolar transistors at high frequencies, various means have been previously proposed to decrease the base resistance thereof. For example, prior art means include a graft base structure including an active and an inactive base region, a structure including an emitter region surrounded by a base region, a multi-emitter structure (which is also called a comb structure) having emitter stripes which are very narrow in width. Also, in order to decrease the capacitance of the base-to-collector junction, a prior art method proposed the decreasing of an impurity concentration of the particular semiconductor region toward which a depletion layer from the base-to-collector junction spreads.

In conventional bipolar transistors, as described above, the base-to-collector junction has extended substantially over the entire area of a semiconductor wafer, resulting in a disadvantage in that the capacitance of the external base-to-collector junction is particularly large. Isoplanar silicon bipolar transistors, which are commercially available, have been improved with respect to this disadvantage by effecting the insulator width isolation of the inactive base region which is continuous to the base-to-collector junction through the utilization of selective oxidization. However, the manufacturing of such transistors has included manufacturing steps which are complicated. Also, in their manufacturing, an erosion effect called "a bird beak effect" might occur in portions of the silicon of the transistors. This bird beak effect is apt to permit either end of the emitter region to extend over the mating base region so as to be connected to the collector region. Even if the emitter region is not connected to the collector region, it has been difficult to control the base width.

Accordingly, it is the principal object of the present invention to eliminate the disadvantages of the prior art practice as described above by the provision of a semiconductor device which has a sharply decreased capacitance of its base-to-collector junction.

It is an object of the present invention to provide a semiconductor device designed and constructed so as to sharply decrease its base resistance.

SUMMARY OF THE INVENTION

According to one aspect thereof, the present invention provides a semiconductor device comprising a semiconductor substrate of a first conductivity type having a relatively high impurity concentration and including a pair of opposite main faces; an electrically insulating film is disposed on one of the main faces of the semiconductor substrate so as to include a plurality of openings in a predetermined pattern thereof; a monocrystalline layer of the first conductivity type is epitaxially grown on each of the openings and has a relatively low impurity concentration; an internal base region of a second conductivity type is disposed on each of the monocrystalline layers; external base regions of the second conductivity type are disposed on the electrically insulating film so as to be electrically connected to an adjacent one of the internal base regions; an emitter region of the first conductivity type is disposed on each of the internal base regions; a base electrode is disposed in ohmic contact with each of the external base regions; an emitter electrode is disposed in ohmic contact with each of the emitter regions, and a collector electrode is disposed in ohmic contact with the other main face of the semiconductor substrate.

BRIEF DESCRIPTION OF THE DRAWINGS

The present invention will become more readily apparent from the following detailed description taken in conjunction with the accompanying drawings in which:

FIGS. 4a through 4c are views useful in explaining the advantages of the present invention, wherein FIG. 4a is a fragmental enlarged cross-sectional view of a conventional bipolar transistor such as shown in FIG. 1g; FIG. 4b is a view similar to FIG. 4a but illustrating the present invention, and FIG. 4c is a graph illustrating the electrical characteristics of the present invention as compared with that of the prior art practice.

DESCRIPTION OF THE PREFERRED EMBODIMENT

Referring now to FIG. 1 of the drawings, there is illustrated a process of manufacturing a conventional high frequency, high output silicon (Si) bipolar transistor designed so as to decrease its base resistance to thereby increase its power gain at high frequencies. In order to manufacture such a transistor, an N+ type semiconductive silicon (Si) substrate 10 is first prepared so as to be doped with a suitable N type-conductivity imparting impurity at an impurity concentration of about $10^{19}$ atoms per cubic centimeter as shown in FIG. 1a. That impurity preferably has a small auto-doping effect and may be antimony (Sb) or arsenic (As). As shown in FIG. 1b, an N− type epitaxially grown layer 12 is disposed on one of the main opposite faces, in this case, the upper main fact of the substrate 10 as viewed in FIG. 1b. The epitaxially grown layer 12 has been doped with arsenic (As) or phosphorous (P) to a low impurity concentration of about $10^{16}$ atoms per cubic centimeter.

Figure 1A:
FIGS. 1a through 1g are cross-sectional views of a conventional high frequency, high output bipolar transistor illustrated in the order to the fabrication steps thereof.
Figure 1B:
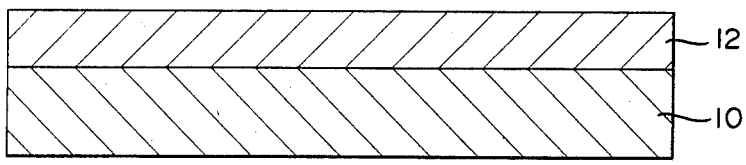
Figure 1C:
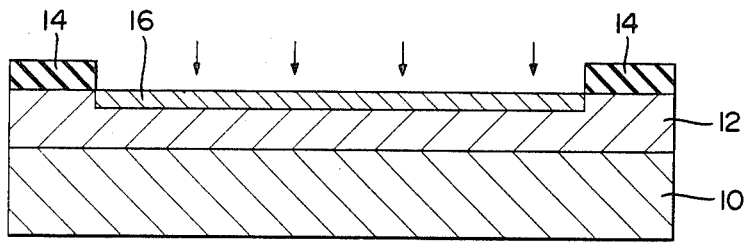

Then, the arrangement of FIG. 1b is oxidized to form an oxide film 14 on the grown layer 12 after which a predetermined portion of the oxide film 14 is removed in a manner which is well known in the art so as to expose that portion of the grown layer overlaid with the removed portion of the oxide film 14. Subsequently ions of boron (B) are implanted into the exposed surface of the grown layer 12 at an impurity concentration of about $5 \times 10^{18}$ atoms per cubic centimeter as shown at the arrows in FIG. 1c to form a boron implanted region 16 having a P+ type conductivity in the grown layer 12. This region 16 forms a base region at a later stage of fabrication.

Figure 1D:
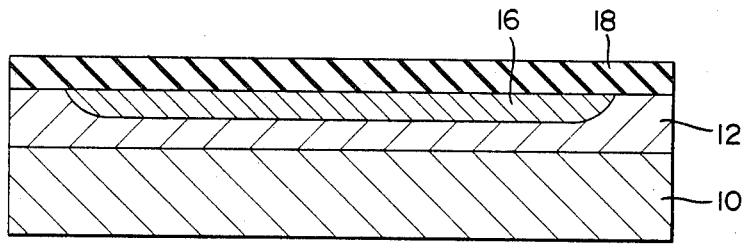

Following this, a CVD technique is used to form an oxide film 18 on the boron implanted region 16 so as to cover the film and be connected to the remaining portion of the oxide layer 14. Then, an annealing is effected at an elevated temperature of about 1000° C. to remove damage to the region 16 caused by the ion implantation and also to make the CVD oxide film 18 more dense. The resulting structure is illustrated in FIG. 1d, wherein the oxide film 18 is shown as including the oxide film 14 as a part thereof and covering both the ion implanted region 16 and the grown layer 14.

In the illustrated example, the ions of boron have been implanted into the exposed surface portion of the grown layer 12 but boron may be deposited on the exposed surface portion followed by the driving of the boron into the grown layer 12 in an oxidizing atmosphere. However, the latter measure is disadvantageous in that the resulting base depth is apt to be irregular within the grown layer 12.

Figure 1E:
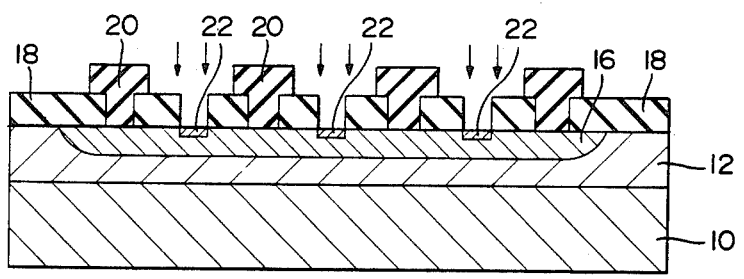

Subsequently, the CVD oxide film 18 is selectively etched to open windows therein for base contacts or electrodes simultaneously with the formation of windows for emitter contractor electrodes to be arranged into a predetermined pattern (see FIG. 1e). Then, the windows for the base electrodes are filled with a photoresist 20 and ions of arsenic (As) are implanted only into the regions 22 exposed to the windows for emitter electrodes to form N+ type emitter regions 22.

The step of implanting the ions of arsenic is important as far as the formation of a shallow emitter depth is concerned. Also, the simultaneous formation of the emitter and base windows significantly improves the accuracy of the photolithography of a mask used for the windows as compared with the formation of the emitter windows separately from the formation of the base windows. In other words, the step of simultaneously forming the emitter and base windows is most important for high frequency, high output bipolar transistors requiring an emitter stripe width on the order of form 0.5 to 2 μm.

Figure 1F:
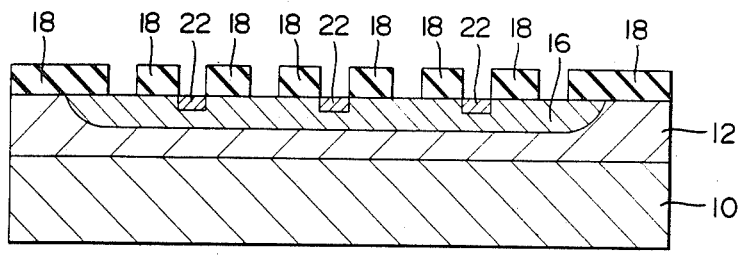

Then, the photoresist 20 filling each of the base windows is removed by utilizing a plasma etching technique as shown in FIG. 1f and a heat treatment is effected to anneal the arrangement of FIG. 1f enough to remove damage to the emitter regions 22 caused by the implantation of the arsenic ions.

Figure 1G:
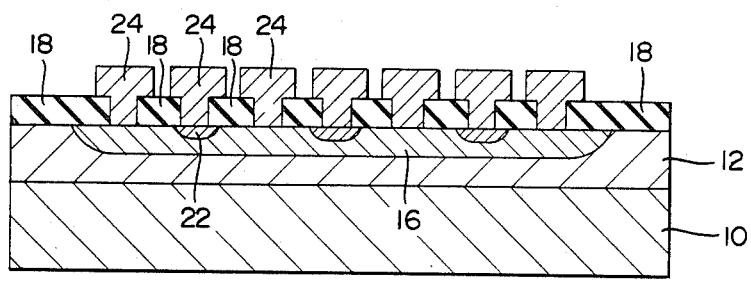

Following this, emitter and base electrodes 24 are respectively disposed in ohmic contact with the emitter and base regions as shown in FIG. 1g. At the same time, a collector electrode is disposed in ohmic contact with the other of lower main face of the semiconductor substrate 10, although the collector electrode is not shown for the sake of simplicity. This results in the completion of the high frequency, high output silicon bipolar transistor including a multi-emitter structure having a very small emitter stripe width.

For shallow junctions, the electrode is preferably of a composite type including a metallic material having a low alloy amount and exhibiting a low resistance, a barrier metal and a highly conductive metallic material.

In addition, various methods have been proposed for decreasing the spacing between the emitter and base electrodes and decreasing the capacitance of a base-to-emitter junction, and that of a base-to-collector junctions and a base resistance by sufficiently shrinking the transistor size according to existing photolithographic techniques.

In the arrangement described above, the arsenic (As) has been used to form the emitter regions for the following reasons: the As implanted emitter region has a diffusion profile following a step function and is small in its emitter push out effect which occurs when phosphorous (P) is utilized to form the emitter regions. This results in a decrease in the capacitance of each of the base-to-emitter junctions and a decrease in the base resistance.

In bipolar transistors of the type described above, how high the power gain can be held at high frequencies generally provides a measure of determining their performance. Between a maximum oscillation frequency $f_{max}$ and a power gain G there is generally held the relationship expressed by:

$$G = 20 \log (f_{max} \div f) \quad (1)$$

where f designates any frequency. Accordingly, in order to maximize the power gain G at a given frequency, it is necessary for the maximum oscillation frequency $f_{max}$ to be of its greatest magnitude at that frequency. In double diffusion type bipolar transistors, this maximum oscillation frequency $f_{max}$ fulfills the expression:

$$f_{max} = \sqrt{\frac{f_T}{8\pi(r_b + r_{eb})C_c}} \quad (2)$$

where $f_T$ designates the product of a common emitter gain multiplied by a bandwidth; $r_b$ is a base resistance; $r_{eb}$ is an emitter ballast resistance and $C_c$ designates a collector capacitance. Also, the base resistance $r_b$ may be expressed by:

$$r_b = r_{con} + r_b' + r_{bb}' \quad (3)$$

where $r_{con}$ designates a resistance of a base contact electrode; $r_b'$ is an external base resistance or an inactive base resistance, and $r_{bb}'$ designates an internal base resistance or a resistance of an active base region disposed directly below an emitter region. Furthermore, the collector capacitance $C_c$ may be expressed by:

$$C_c = C_b' + C_{bb}' + C_{pad} \quad (4)$$

where $C_b'$ designates an external base-to-collector capacitance or the capacitance of the inactive base region; $C_{bb}'$ is an internal base-to-collector capacitance of the active base region, and $C_{pad}$ designates an MOS capacitance developed between the semiconductor epitaxial layer and a pad.

Accordingly, in order to render the maximum oscillation frequency $f_{max}$ high, it is necessary to increase the current gain bandwidth product $f_T$ and decrease $(r_b + r_{eb})C_c$. Furthermore, $f_T$ may be expressed by:

$$\frac{1}{f_T} = r_e(C_{Te} + C_c) + \frac{W_b^2}{nD_{nb}} + r_{sc}C_c + \frac{X_m}{2V_{sc}} \quad (5)$$

where $r_e$ designates an emitter resistance for a forward bias; $C_{Te}$ is a capacitance of a depletion layer spread between the emitter and base regions; $W_b$ is a base width; $D_{nb}$ is the mean diffusion coefficient of electrons in the base region; n is a density of electrons in the base region; $r_{sc}$ is a series collector resistance; $X_m$ is a width of a depletion layer spread between the collector and base regions, and $V_{sc}$ designates an electron velocity within the last-mentioned depletion layer. Furthermore, the density of electrons n may be expressed by:

$$n = \frac{\left(\ln \frac{N_{BE}}{N_{BC}}\right)^2}{\ln \frac{N_{BE}}{N_{BC}} - 1} \quad (6)$$

where $N_{BE}$ designates an acceptor concentration at an emitter-to-base junction, and $N_{BC}$ designates an acceptor concentration at a collector-to-base junction, while $l_n$ denotes the symbol for a Napierian logarithm.

Accordingly, bipolar transistors of the conventional construction have contemplated the improvement of the power gain by improvements due to the shrinking effected at present in expressions (2) and (5). Therefore, the existing improvements have reached such an extent that there is no room for further improvement without using further shrinking techniques. More specifically, by decreasing the emitter stripe width, it is normally contrived to reduce both the internal base resistance $r_{bb}'$ and the internal base-to-collector capacitance $C_{bb}'$ as described above. For example, if the emitter width of 2 $\mu$m decreases to 0.5 $\mu$m then the resistance $r_{bb}'$ and the capacitance $C_{bb}'$ can be reduced by a factor of 4. At present, an emitter structure having an emitter stripe width on the order of 0.1 $\mu$m has be experimentally produced by exposure of the transistor wafer to an electron beam or an X-ray but only a width of 0.5 $\mu$m is safely possible for production.

Also, in the prior art practice, the base-to-collector junction has been formed throughout substantially the entire area of the semiconductor wafer so that the capacitance $C_b'$ of the external base-to-collector junction has been particularly large. In order to reduce this capacitance of the external base-to-collector junction, the inactive base region for the collector-to-base junction might be partly cut by oxide films. For example, isoplanar bipolar transistors having the capacitance of the external base-to-collector junction thus reduced through selective oxidation are commercially available from Fairchild Camera and Instrument Corporation in the United States. However, manufacturing such transistors has required the steps of etching the nitride and silicon and so on. Those steps are complicated and, in addition, an erosion effect called a "bird beak" effect occurs on one portion of the particular silicon. The bird beak is apt to result in the occurrence of the so-called CE piping where the emitter region at either end extends over the mating base region so as to be connected to the associated collector region. Alternatively, even if the bird beak does not cause the CE piping, the control of the base width has been difficult. This has resulted in the provision of only bipolar transistors which are low in their collector-base breakdown voltage $V_{CBO}$ and low in their collector-emitter breakdown voltage $V_{CEO}$ because there voltages are limited by the emitter-to-base punch-through voltage.

The present invention contemplates the elimination of the disadvantages of the prior art practice as described above by the provision of a semiconductor device capable of sharply decreasing the capacitance of its collector-to-base junction in a relatively easy manner.

Referring now to FIGS. 2a through 2h wherein like reference numerals of 100 series designate the components which are identical to or correspond to those shown in FIGS. 1a through 1g, one embodiment according to the present invention is illustrated in the order to the fabrication steps thereof. A silicon (Si) substrate 110, highly doped with a suitable n type-conductivity imparting impurity, is oxidized so as to dispose an oxide film 114 on one of the opposite main faces, in this case, the upper main fact thereof. Then, the oxide film 114 is selectively etched to form openings in a predetermined pattern therein to reach the upper main face of the substrate 110.

Figure 2A:
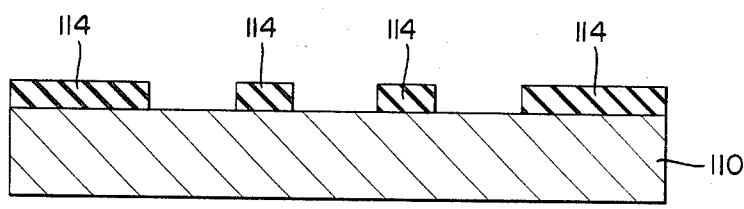
FIGS. 2a through 2h are cross-sectional views of one embodiment according to the semiconductor device of the present invention illustrated in the order to the fabrication steps thereof.

The resulting structure is shown in FIG. 2a.

If desired, the oxide film 114 may be replaced by another electrically insulating film, for example, a nitride film.

Figure 2B:
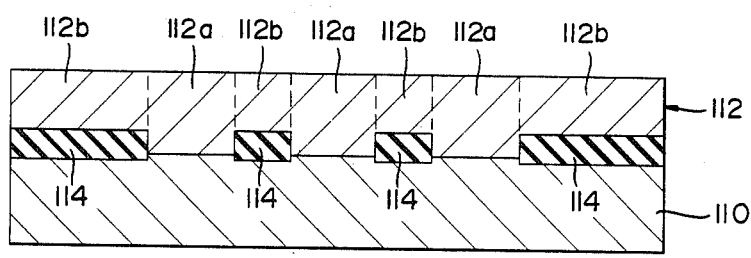

Then, a relatively lightly doped n type silicon (Si) is epitaxially grown on both the remaining portions of the oxide film 114 and the exposed portions of the upper main face of the substrate 110 or in the above the openings formed in the oxide film 114 to dispose an $N^-$ type grown layer 112 on the side of the upper substrate face as shown in FIG. 2b. As shown in FIG. 2b, those portions 112a of the layer 112 grown in and above the openings in the oxide film 114 or on the exposed portions of the upper main fact of the substrate 110 are of monocrystalline silicon while those portions 112b of the layer 112 grown on the oxide film 114 are not of monocrystalline silicon. That is, the portions 112b are of polycrystalline silicon.

In the epitaxial growth, as described above, the grown layer portions 112a and 112b may have respective thicknesses varied at will by changing the conditions for the epitaxial growth.

Following this, the outer region of each of the outermost polycrystalline silicon portions 112b is removed by dry-etching silicon. This dry etching is uniformly effected over the whole surface area of the wafer because the outer region is underlaid with the adjacent portion of the oxide film 114.

Figure 2C:
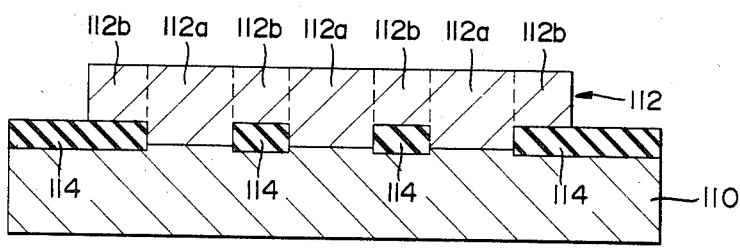

The resulting structure is shown in FIG. 2c.

In this dry etching, the thicknesses of the polycrystalline portion 112a and the monocrystalline portion 112b may be varied at will through the utilization of the difference in etching rate between portions 112a and 112b.

Figure 2D:
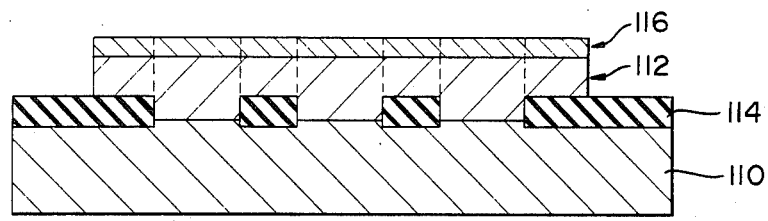

Then, ions of boron $B^+$ are implanted into the surface of the grown layer 112 to dispose a $P^+$ type region 116 thereon as shown in FIG. 2d. This region 116 forms a $p^+$ type base region.

In that state, the $P^+$ type base region 116 is subjected to thermal annealing. At that time, the boron has a very high diffusion coefficient in the polycrystalline portion 112b and therefore soon reaches that portion of the oxide film 114 overlaid with that portion 112b. Also, the diffusion proceeds toward each monocrystalline portion 112a from a boundary between the latter portion and the adjacent polycrystalline portion 112b. On the other hand, the boron in the monocrystalline portion line 112a is also diffused in the downward direction as viewed in FIG. 2d or toward the grown layer 112 but it is not so deeply diffused into the grown layer 112a because the boron has a diffusion coefficient equal to about one tenth that in the polycrystalline portion 112b. As a result, the monocrystalline portion 112a disposed in and above each of the openings formed in the oxide film 114 is left to extend toward the upper surface of the P+ type base region 116 from the periphery of the mating opening at a position somewhat less in level than the mouth thereof while being tapered until it terminates at a flat end surface to form a predetermined spacing between the portion and the surface of the base region 116 as shown by the reference numeral 112 in FIG. 2e.

Figure 2E:
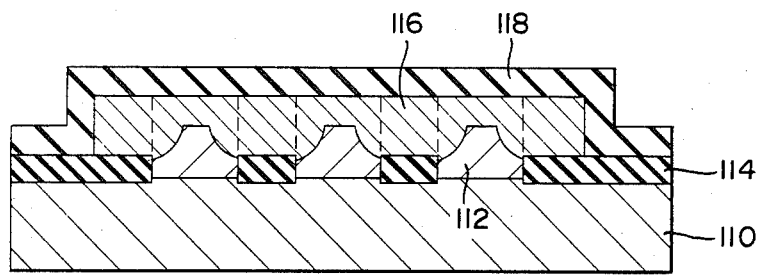

Then, thermal annealing is preferably effected in an atmosphere of nitrogen ($N_2$), helium (He) or argon (Ar) after the P+ type base region 116 has been covered with an oxide film 118 deposited on the region 116 according to the CVD technique (see FIG. 2e). This measure is effective for preventing a decrease in impurity surface concentration.

In this way, a P+ type external base region has been formed in each of the polycrystalline portions 112b to reach the adjacent portion of the oxide film 114 while a P+ type internal base region has been formed in each of the monocrystalline portions 112a to include a shallow PN junction and be electrically connected to the adjacent P+ type external base regions.

When the oxide film 118 thus formed is annealed at a temperature of from 1000° to 1100° C., the film is dense enough to increase an etching rate to about 1.2 times that of oxide films thermally formed.

Subsequently, the annealed CVD oxide film 118 is selectively etched to open windows therein for base and emitter contacts or electrodes in a predetermined pattern in which the windows are centrally located on the external and internal base regions and then only the windows for base electrodes are filled with a photoresist 120.

Figure 2F:
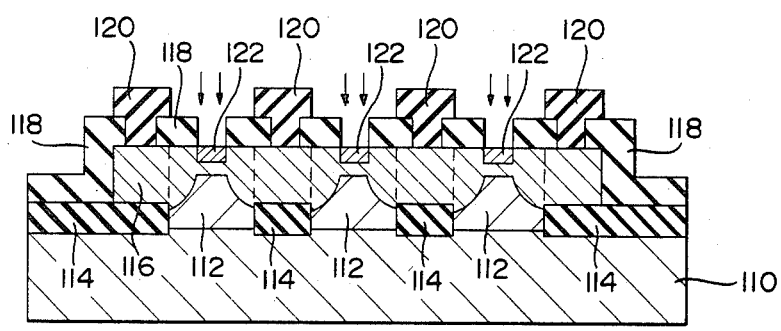

The resulting structure is shown in FIG. 2f.

Thereafter, ions of arsenic As+ are implanted into the arrangement of FIG. 2f as shown by the arrows in FIG. 2f to dispose N+ type emitter regions 122 in the P+ type base region 116 under the windows for the emitter electrodes so as to leave the base region 116 or an interval base region having a predetermined width with PN junctions formed therebetween one for each emitter region.

Then, the arrangement of FIG. 2f is head treated in a furnace after the photoresist 120 is removed from the arrangement. The heat treatment is effected for the purpose of removing damage to the silicon caused by the implantation of arsenic ions.

Figure 2G:
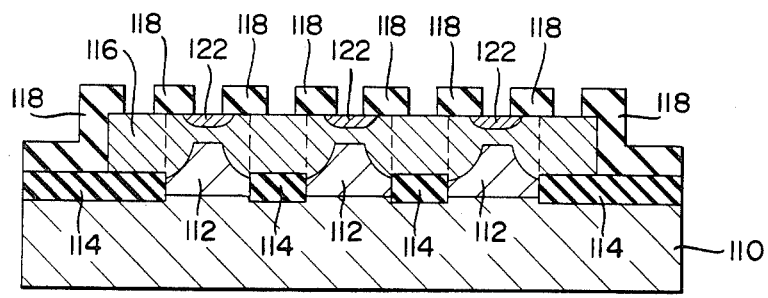

FIG. 2g shows the arrangement after the heat treatment.

Figure 2H:
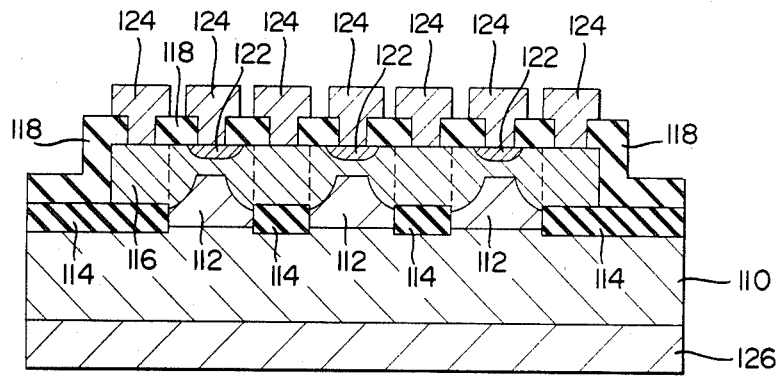

Finally, electrodes 124 are disposed in the windows so as to be in ohmic contact respectively with the P+ type base regions 116 and the N+ type emitter regions 122 as shown in FIG. 2h. Simultaneously, a collector electrode 126 is disposed in ohmic contact with the other main fact of the substrate 110. This results in the completion of a silicon bipolar transistor.

From the foregoing it is seen that the bipolar transistor of the present invention includes active regions disposed only in the monocrystalline regions and includes polycrystalline regions into which no depletion layer spreads. Therefore, it is possible to dispose all PN junctions in single crystals having no crystal defect. Accordingly, the present invention is free from the problem that a leakage current is high with the PN junction disposed in a crystal which is not a single one. This results in very good junctions.

Figure 3:
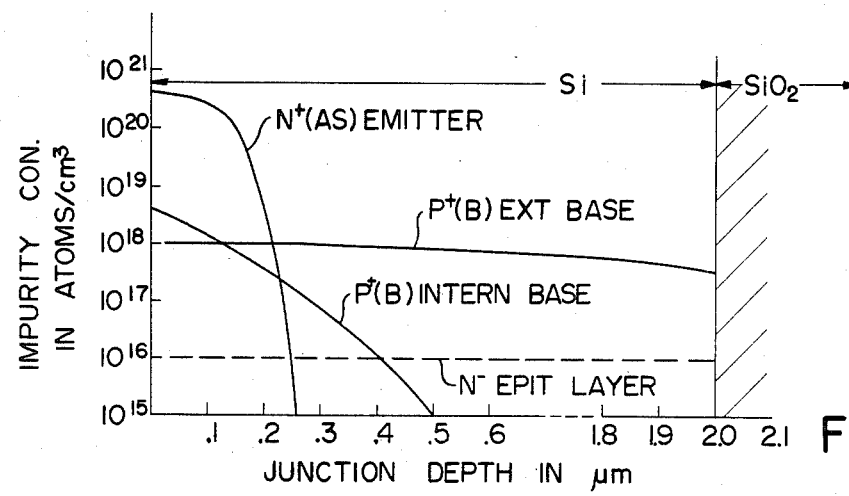
FIG. 3 is a graph illustrating profiles of impurity concentrations useful in explaining how high impurity concentrations are uniformly distributed in an inactive base region (or an external base region) according to the present invention.

In FIG. 3, wherein the ordinate represents an impurity concentration in atoms per cubic centimeter in a logarithmic scale and the abscissas represents a junction depth in $\mu$m, there are shown vertical profiles of impurity concentrations in the P+ type base and N+ type emitter regions included in bipolar transistors such as described above in conjunction with FIGS. 2a through 2h. The curve labelled "P+ (B) INTERN BASE" depicts a vertical profile of the impurity (boron) concentration developed in an internal base region disposed directly under the N+ type emitter region and formed of monocrystalline silicon. Also, the curve labelled "P+ (B) EX BASE" depicts a vertical profile of the impurity (boron) concentration developed in an external base region which is not disposed directly under the N+ type emitter region and not formed of the single crystalline silicon. From curve P+ (B) EX BASE, it is seen that the impurity, in this case, a high concentration of boron, is diffused into the external base region throughout the entire depth thereof, designated by Si in FIG. 3, until it reaches the hatched portion labelled $SiO_2$ which corresponds to the oxide film 114 overlaid with that external base region as shown in FIG. 2h. Thus, the oxide film 114 serves to prevent a further diffusion of the impurity or boron.

Furthermore, in FIG. 3, the curve labelled N+ (As) EMITTER describes a vertical profile of the impurity (arsenic) concentrations developed in the N+ type emitter regions, such as shown by 122 in FIG. 2g or 2h. Also, a dotted horizontal line designates an impurity concentration in an epitaxial grown layer such as shown by 112 in FIG. 2h.

In conventional bipolar transistors, such as described above in conjunction with FIGS. 1a through 1g, a vertical profile of the impurity concentrations similar to that shown by curve P+ (B) INTERN BASE has been developed in either of the interval and external base regions and the base resistance $r_b$ has been of a magnitude determined by magnitudes of $r_{con}$, $r_b'$ and $r_{bb}'$ appearing on the righthand side of the expression (3) as described above.

In the present invention, a resistance corresponding to the external base resistance $r_b'$ can be decreased to about one tenth the conventional magnitude of the resistance $r_b'$ because the impurity concentration in the external base region can be higher than that of conventional external base regions. Also, from the comparison of the collector capacitance $C_c$, it is seen that in the present invention, the external base-to-collector junction capacitance $C_b'$ appearing on the righthand side of the expression (4) may be reduced to about one half or one third of the conventional magnitude. This is because the base-to-collector junction is separated into a plurality of discrete junction portions by split portions of the oxide film 114, although the internal base-to-collector junction capacitance remains unchanged. Furthermore, it is possible to improve the MOS capacitance $C_{pad}$ by thickening an underlaying oxide film, such as the oxide film 114. However, since an oxide film which is too thick may cause problems concerning cracks, for example, the present invention contemplates the improvement of $C_{pad}$ by only from 10 to 20 percent of the conventional magnitude.

Considering the thickness of the N− type epitaxially grown layer 112 or an N− type collector region, conventional bipolar transistors have included the collector region epitaxially grown to a thickness of about 2.4 μm. This thickness includes a thickness of 0.6 μm forming a base depth and the remaining thickness of 1.8 μm serving to hold the required reverse breakdown voltage across the collector and base regions. This voltage follows a well-known experimental expression:

$$V_{CEO} = \frac{V_{CBO}}{4\sqrt{h_{FE}}}$$

where $V_{CEO}$ designates a reverse breakdown voltage across a collector and an emitter region; $V_{CBO}$ is a reverse breakdown voltage across the collector and base regions; and $h_{FE}$ designates a current gain in the common emitter configuration. From the above expression, the current gain $h_{FE}$ of 100 could provide what had a $V_{CBO}$ of 35 volts and a $V_{CEO}$ of 11 volts. In this example, a difference between the $F_{CEO}$ and $V_{CBO}$ amounted to 24 volts. However, the required breakdown voltage is actually determined by the lower voltage or $V_{CEO}$. In the conventional structure, $V_{CBO}$ has been determined by the effect of a curvature exhibited by the periphery of the base with the result that the thickness of the n⁻ type epitaxially grown layer has been larger than necessary.

In contrast, the present invention can be designed to render $V_{CEO}$ substantially equal to $V_{CBO}$. Accordingly, $V_{CEO}$ is determined by the thickness of that portion of the N⁻ type epitaxially grown layer disposed just under each of the emitter regions but it does not depend upon $V_{CBO}$. This means that the epitaxially grown layer 112 is only required to have a thickness on the order to 2.0 μm. Therefore, the resulting series collector resistance can be lowered.

In bipolar transistors including the collector region connected to external base regions through junctions formed therebetween, the operation performed therein does not quite reach the collector region. Accordingly, the base configuration according to the present invention is ideal. More specifically, conventional bipolar transistors have included the N⁻ type collector layer extending to that region through which no collector current flows while that region which should be most utilized as the external base region has not been sufficiently employed. In contrast, the present invention has its $V_{CBO}$ determined by that portion of the last-mentioned region connected to the thinnest portion of the N⁻ type collector layer. This is attained by controlling the thickness of the underlaying oxide film to determine a width of an associated depletion layer so that $V_{CBO}$ is 11 volts. As a result, the external base resistance $r_b'$ becomes extremely low while the series collector resistance is equal to about 0.78 times its conventional magnitude. In this way, the present invention has improved the base resistance $r_b$ appearing in the expression (2) and the collector capacitance $C_c$ and the series collector resistance $r_{sc}$ appearing in the expression (5). Accordingly, the present invention provides a semiconductor device having a much improved $r_b'$, $C_c$ and $r_{sc}$.

Also, it has been found that the present invention is superior to the isoplanar structure described previously. In the isoplanar structure, it has been difficult to control irregularity in the etching of silicon (Si) and internal strains occurring between the isolating oxide film and the nitride are apt to cause defects in the silicon (Si) included in the active silicon region. On the contrary, the present invention has no defect caused in the silicon involved because the polycrystalline portion of the base region absorbs interval stresses causing defects which are apt to occur in the silicon and such defects are not caused in the monocrystalline portion thereof. Also, the present invention can simply decrease the capacitance of the collector-to-base junction without using a material such as nitride in which internal stresses are easily generated.

Figures 4A, 4B, 4C:
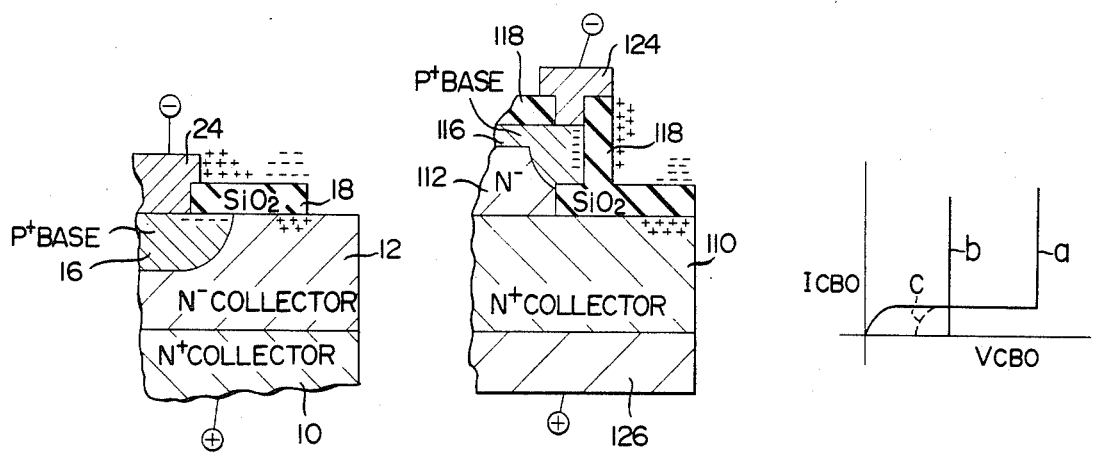

Furthermore, the present invention is advantageous in improving the reliability which will now be described with reference to FIGS. 4a, 4b, and 4c. FIG. 4a show, in an enlarged cross-section, that portion of a conventional base-to-collector junction located on a periphery of an associated semiconductor chip. Therefore, like reference numerals designate the components identical to those shown in FIG. 1g. The illustrated arrangement is normally operated with both a positive potential designated by the plus symbol encircled by a circle and applied to the N⁺ type substrate 10 in this case labelled N⁺ COLLECTOR and a negative potential designated by the minus symbol encircled by a circle and applied to the base electrode 24. Therefore, electrical charges respectively designated by the minus and plus symbols are accumulated on the upper and lower surfaces as viewed in FIG. 4a of the oxide film 18 and labelled SiO with respect to time. Therefore, if the P⁺ type base region 16, labelled P⁺ BASE, is low in its surface impurity concentration, then the surface thereof is inverted to an N type conductivity as shown by the minus symbol within the base region 16. Thus, the $I_{CBO}$-$V_{CBO}$ characteristic is such that a flow of channel current is caused as shown at curve a in FIG. 4c, wherein the $I_{CBO}$ is plotted on the ordinate against $V_{CBO}$. Accordingly, even though the base region 16 is maintained so as to be sufficiently high in surface impurity concentration, that portion of the N⁻ type collector region 12 contacting the oxide film 18 and adjacent to a dicing line is apt to be inverted to a P type conductivity. Under these circumstances, the spread of a depletion layer causes a flow of channel current at and above a certain magnitude of the $V_{CBO}$, as shown at dotted curve c in FIG. 4c. This means that the prior art type bipolar transistors have been extremely unstable with respect to their reliability.

FIG. 4b is a view similar to FIG. 4a but illustrating the present invention. Therefore, like reference numerals designate the components identical to those shown in FIG. 2h. Even if that portion of the P⁺ type base region 116 adjacent to the oxide film 118 forms an inversion layer, as shown by the minus symbol denoted on the lefthand side or the inside as viewed in FIG. 4b of the oxide film 118, then no flow of channel current is caused because a region forming a base-to-collector junction is located on the inside of the oxide film 118. Furthermore, it is to be noted that in the present invention, the N⁺ type collector region is substituted for the conventional N⁻ type collector which has been apt to be partly inverted to the P type conductivity. Accordingly, there is no fear that an inversion will be caused. In other words, it has previously been required to render an almost perfect passivation, whereas the present invention provides an extremely stable structure even with rendering of a not so perfect passivation. Accordingly, the present invention can have a stable $I_{CBO}$-$V_{CBO}$ characteristic, as shown by curve b in FIG. 4c.

From the foregoing it is seen that the present invention provides high-frequency, high output bipolar transistors having an extremely excellent performance and manufactured so as to be consistently uniform with good reproducibility.

While the present invention has been illustrated and described in conjunction with a single preferred embodiment thereof, it is to be understood that numerous changes and modifications may be resorted to without departing from the spirit and scope of the present invention.

What we claim is:

1. A semiconductor device having protected edges and comprising a semiconductor substrate of a first conductivity type having an impurity concentration and having a pair of opposite main faces, said substrate having an electrically insulating film on one of said pair of opposite faces, said film including a plurality of apertures arranged in a predetermined pattern thereon; an epitaxially grown semiconductor layer with a low impurity concentration with respect to said substrate disposed on said electrically insulating film including said apertures so as to form a single crystalline grown layer portion within each of said apertures and polycrystalline grown layer portions on portions of said electrically insulating film including no apertures, said epitaxially grown semiconductor layer being doped with a second conductivity type imparting impurity so as to form an external base region of said second conductivity type in each of said polycrystalline grown layer portions so as to abut said electrically insulating film and so as to form an internal base region of said second conductivity type in each of said single crystalline grown portions which are respectively electrically connected to adjacent ones of said external base regions and so as to form a PN junction therebetween, wherein said internal base regions and said external base regions are formed such that an emitter region of said first conductivity type is formed on each of said internal base regions so as to be shallower than its associated internal base region and wherein a base electrode and an emitter electrode and a collector electrode are formed in ohmic contact with each of said external base regions, each of said emitter regions and the other face of the pair of main faces of said semiconductor substrate respectively, and wherein said insulating film is formed so as to cover the edges of one of said internal base regions and said external base regions and wherein said polycrystalline regions of said epitaxially grown layer are formed so as to be shallower than said single crystalline grown layer portions.

* * * * *